(12) United States Patent
Yun et al.

(10) Patent No.: US 7,544,447 B2
(45) Date of Patent: Jun. 9, 2009

(54) METHOD OF FORMING A MASK PATTERN FOR A SEMICONDUCTOR DEVICE

(75) Inventors: In Soo Yun, Gyeonggi-do (KR); Gab Hwan Cho, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 235 days.

(21) Appl. No.: 11/564,090

(22) Filed: Nov. 28, 2006

(65) Prior Publication Data

US 2007/0124719 A1      May 31, 2007

(30) Foreign Application Priority Data

Nov. 30, 2005   (KR) ...................... 10-2005-0115440

(51) Int. Cl.
*G03F 9/00*   (2006.01)

(52) U.S. Cl. ................................. 430/5; 430/30; 716/19
(58) Field of Classification Search ...................... 430/5, 430/30; 716/19
See application file for complete search history.

(56) References Cited

U.S. PATENT DOCUMENTS 6,263,299 B1 *   7/2001   Aleshin et al. ................. 703/5
6,472,108 B1 *  10/2002   Lin ............................... 430/5

\* cited by examiner

*Primary Examiner*—Christopher G Young
(74) *Attorney, Agent, or Firm*—Sherr & Vaughn, PLLC

(57) ABSTRACT

A method of forming a mask pattern from a design pattern. A method may effectively compensate for pattern distortion resulting from an optical proximity effect (OPE). A method may obtain a precise line width. A method includes a first mask design processing and a second mask design processing.

10 Claims, 3 Drawing Sheets

METHOD OF FORMING A MASK PATTERN FOR A SEMICONDUCTOR DEVICE

The present application claims priority under 35 U.S.C. 119 and 35 U.S.C. 365 to Korean Patent Application No. 10-2005-0115440 (filed on Nov. 30, 2005), which is hereby incorporated by reference in its entirety.

BACKGROUND

The technical challenges of forming a mask pattern may be influenced by the requirement of precision of a pattern formed on a semiconductor substrate. If an optical proximity effect (OPE) of a mask pattern is not adequately taken into consideration, a line width of a mask pattern may be distorted. If a line width of a mask pattern is distorted, the linearity of the line width may become short. Distortions in line width may influence characteristics of a semiconductor device.

Photolithography technology may cope with mask design sensitivities to adjust the quantity of light transmitted to a mask. Photolithography maybe essential in manufacturing some semiconductor devices. Photolithography may be performed by uniformly applying a photo resist layer on a wafer, exposing the applied photo resist layer using a photo mask (which may have a predetermined layout), and/or developing the exposed photo resist layer to from a specific pattern.

Since some semiconductor devices may have high-density integration, a design rule may have a fine scale. In a photolithography process, the optical proximity effect (OPE) between neighboring patterns may cause defects. If a quadrilateral pattern is formed, various phenomenons caused by OPE may occur. Examples of phenomenons are: a corner rounding phenomenon in which corners of the quadrilateral pattern are rounded by diffraction of light and/or a phenomenon in which sparsely collected patterns in a region (e.g. an isolated region) are patterned to have a small size compared to patterns in a densely collected region.

Examples of methods capable of minimizing distortion of light caused by patterns formed on a mask may include optical proximity correction (OPC) technology and phase shifting mask technology. Optical proximity correction may correct diffraction of light using a pattern. Phase shifting mask technology may increase optical contrast and resolution.

Various methods are used in OPC technology. A rule based OPC method may change a correction value into a rule according to an arbitrary reference and perform pattern correction based on a rule. A model based OPC method may predict a completed shape on a wafer, which has passed through a mask process, a lithography process, and/or an etching process. A model based OPC may predict based on types of various patterns and build a model library. A model based OPC may check performance results through optical rule checking (ORC) after application of a model library and calculating a correction value. There may be methods which combine a rule based OPC method and a model based OPC method.

Mask data processing (MDP) may make up a mask pattern different from a design pattern such that the final completion dimensions has design pattern dimensions that consider a conversion difference between respective processes of forming a pattern that may be important. MDP may include changing a mask pattern by a figure operation, a design rule checker (DRC), an OPC for correcting an OPE after the MDP, and/or another similar method. These processing methods maybe performed so that a mask pattern is properly corrected and/or the final completion dimensions reach a desired dimension.

FIG. 1 illustrates a flow of forming a mask pattern using a model based OPC method. As illustrated in FIG. 1, a database for a design pattern (S10) may be subjected to design verification with a DRC (S20). Mask data preparation (MDP) may change a mask pattern (S30). An OPC may correct an OPE (S40). The results of an OPC may be checked through ORC and may be corrected (S50). If correction is required more than one time, an OPC environment including various parameters may be adjusted and an OPC may be performed again (S60). If correction is not required again, pattern generation may be performed (S70). Data may then be sent to a mask shop (S80).

The flow of forming a mask pattern using a model based OPC method may have difficulty in predicting all layout patterns diversified with the lapse of time, no matter how many test patterns may be used to form a model pattern. A model based OPC method may be limited to building and application of a model library. In some circumstances, an OPC may not be entirely effective. In a process of forming a mask pattern, a pattern may be corrected again after an ORC. An OPC environment may include various parameters that may be adjusted and then the OPC may be performed. In some circumstances, process time may be relatively long, process failure may be caused by manually performing an OPC directly multiple times, and/or a pattern bridge phenomenon may occur.

SUMMARY

Embodiments relate to a method of forming a mask pattern for a semiconductor device. Embodiments may be capable of effectively compensating for pattern distortion resulting from an optical proximity effect (OPE). Embodiments may obtain a precise line width.

Embodiments relate to a method that may include at least one of the following steps: performing design verification on a database for the design pattern by a design rule checker (DRC); performing first mask data processing (MDP) of a changing design-verified pattern; performing optical proximity correction (OPC) on a mask pattern after a first MDP; checking results of a OPC and correcting OPC results through optical rule checking (ORC); and/or after a pattern portion undergoes bad correction to an optical proximity effect (OPE), performing a second MDP to correct results of an ORC. In embodiments, an OPC may include model based OPC. Embodiments may generate a mask pattern and send data to a mask shop, after a second MDP is performed.

BRIEF DESCRIPTION OF DRAWINGS

Example

Example

DETAILED DESCRIPTION

Figure 1:
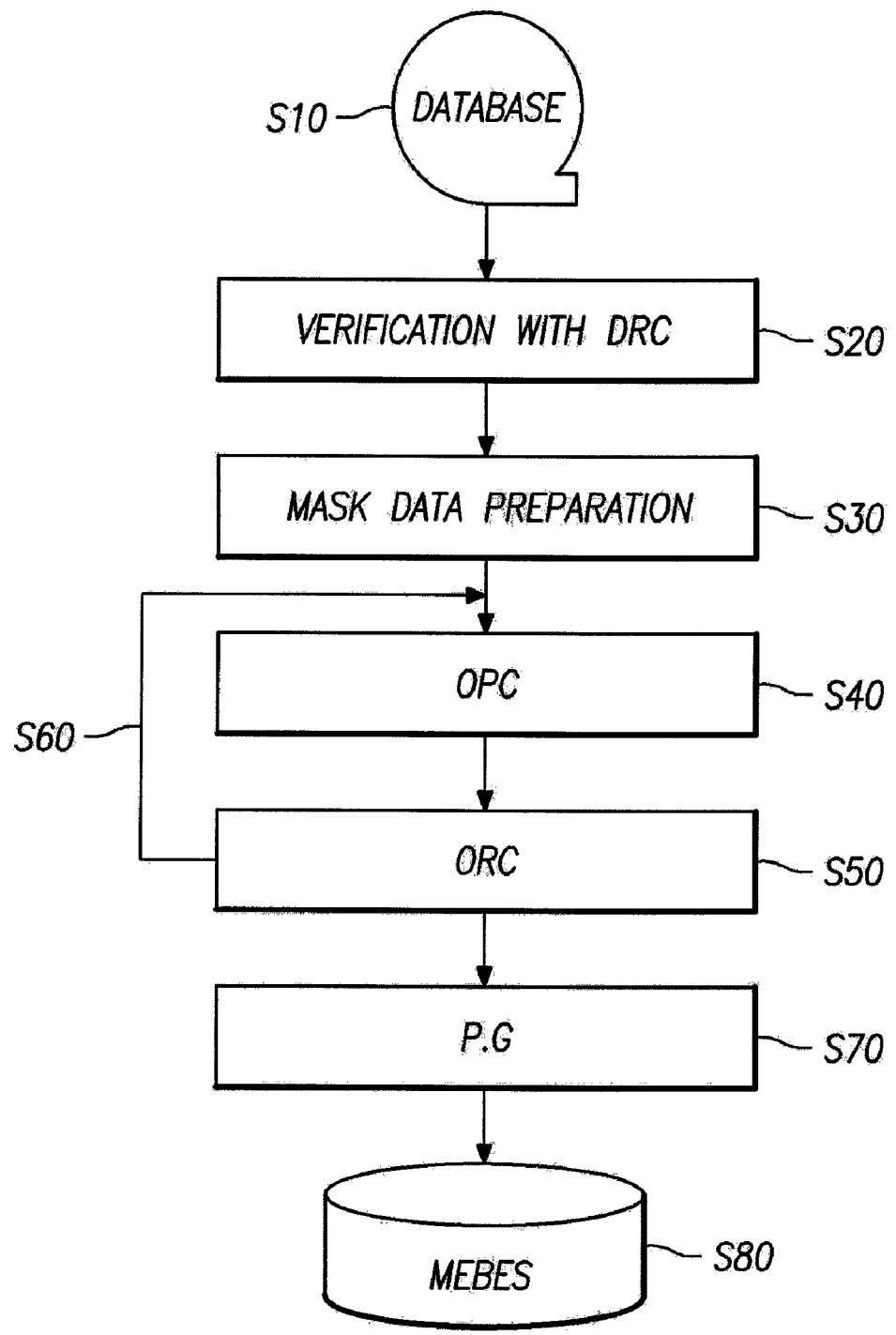
FIG. 1 illustrates a flow chart of forming a mask pattern using a model based OPC method.
Figure 2:
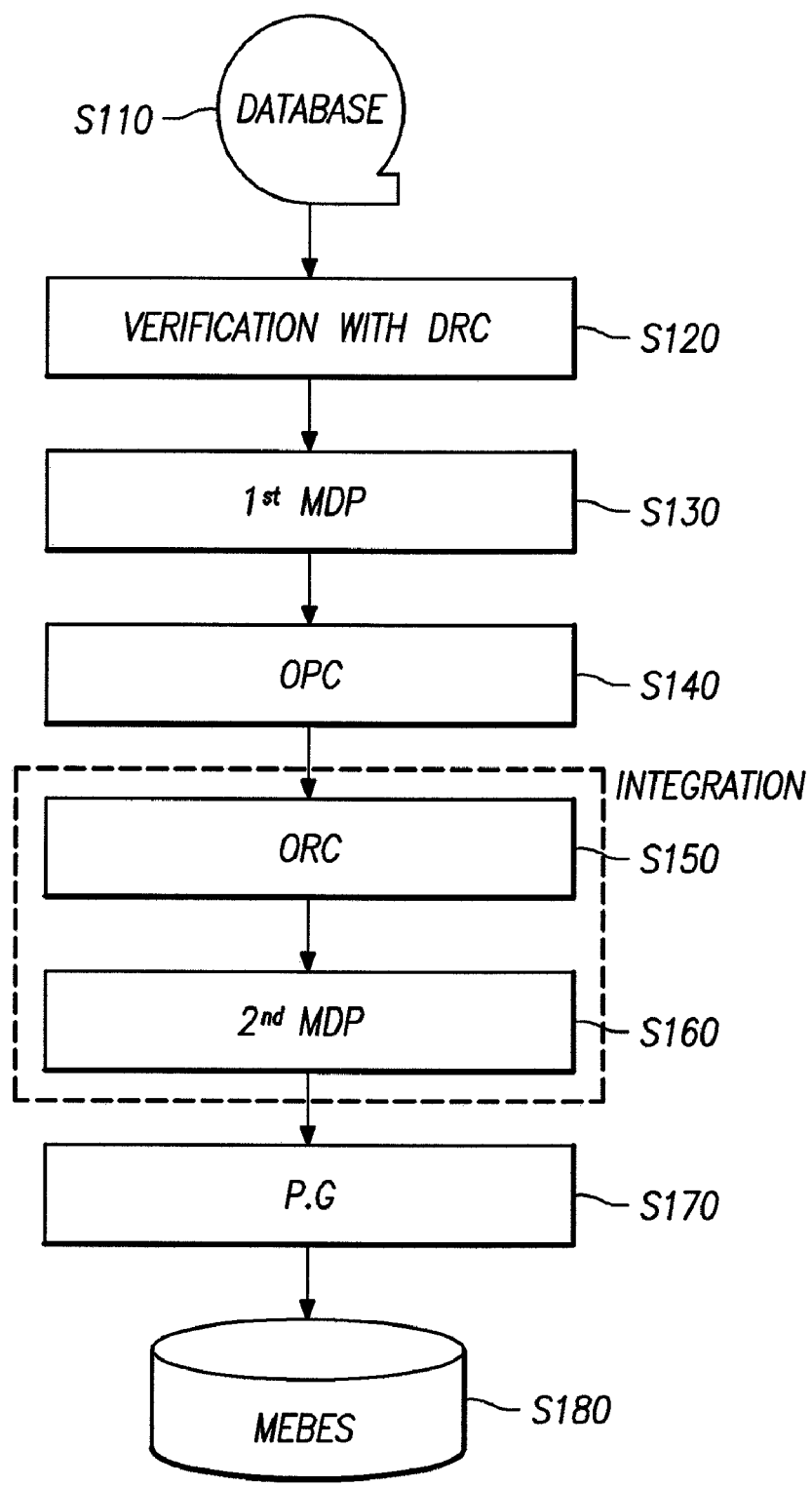
FIG. 2 illustrates a flow chart of forming a mask pattern using a model based OPC method, according to embodiments.

Example FIG. 2 illustrates a flow chart of forming a mask pattern using a model based OPC method, according to embodiments. As illustrated in FIG. 2, a database for a design pattern (S110) may be subjected to design verification with a design rule checker (DRC) (S120). An output of a design rule check (S120) may be input into a first mask data processing (MDP) for changing a mask pattern (S130). An output of a first MDP (S130) may be input into optical proximity correction (OPC) for correcting an optical proximity effect (OPE) (S140). The results of OPC (S140) may be checked and/or corrected through optical rule checking (ORC) (S150).

If re-correction is required, a second MDP for correcting a result value maybe performed (S160). In embodiments, a second MDP (S160) may only correct a pattern of a portion needing correction (S160). A pattern generation may be performed (S170). Data sent to a mask shop (S180). In embodiments, the second mask design processing may correct bad corrections to an optical proximity effect. In embodiments, the second mask design processing may only correct portions of the design pattern that need corrections to an optical proximity effect.

In embodiments, there is no need for a model based OPC method that has to predict all patterns and build and apply a model library. In embodiments, after an ORC checks and/or corrects OPC results, the ORC results are received as inputs and a second MDP is performed on a portion needing correction. With an ORC cooperating with a MDP, pattern distortion resulting from OPE may be compensated, in accordance with embodiments.

Figure 3:
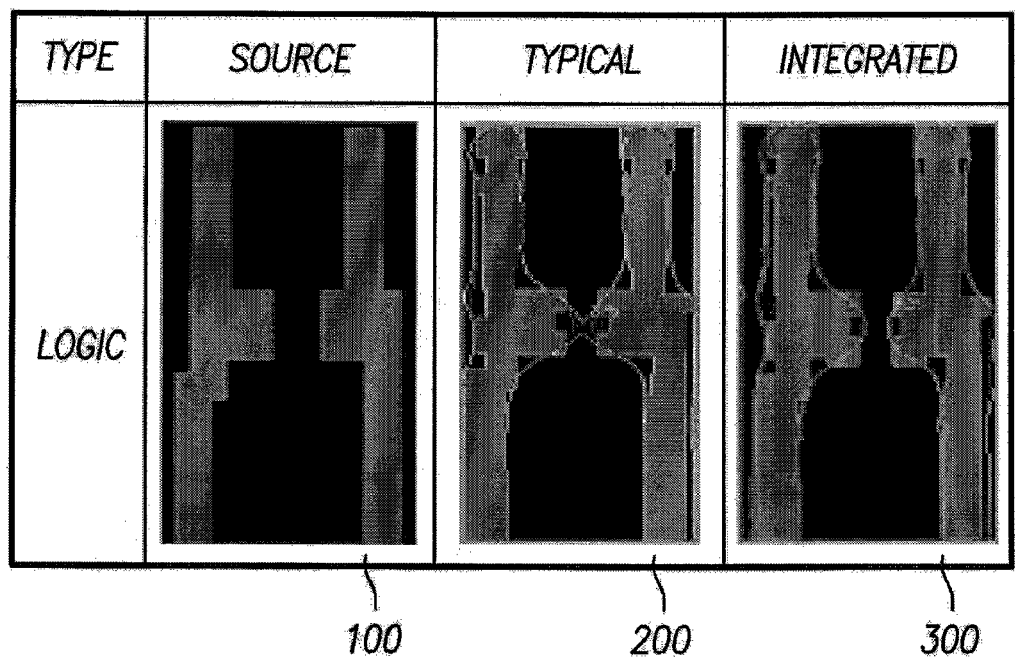
FIG. 3 illustrates a table with exposure contour images, in accordance with embodiments.

Example FIG. 3 illustrates a table in which an exposure contour image, in accordance with embodiments. An exposure coutour of a pattern formed through a process of forming a mask pattern with a second MDP process is compared to a process of forming a mask patter without a second MDP process, in accordance with embodiments. Image 100 illustrates an example design pattern. Image 200 illustrates an exposure contour image of a pattern formed through process of forming a mask pattern that implements only one MDP process. Image 300 illustrates an exposure contour image of a pattern formed through a process of forming a mask pattern that implements at least two MDP processes, in accordance with embodiments.

In embodiments, an exposure image of a final completion pattern may be formed to be identical to a design pattern. An OPC may be effectively performed on various layout patterns, in accordance with embodiments. In a process of forming a mask pattern, a second MDP may be performed after an ORC and then the OPC proceeds systemically. In embodiments, process time of an OPC can be minimized by preventing an OPC process from being processed a second time. In embodiments, because effective optical proximity compensation is possible, a pattern bridge phenomenon may be prevented.

Embodiments relate to a method of forming a mask pattern for a semiconductor device that may effectively compensate various layout patterns for pattern distortion resulting from an optical proximity effect (OPE). In embodiments, a process of forming a mask pattern may include a second MDP performed after an ORC. A OPC may then proceed systemically. In embodiments, process time caused by performing the OPC again may be prevented. In embodiments, since effective optical proximity compensation is possible, a pattern bridge phenomenon may be prevented and a mask for forming a pattern having precise line widths may be manufactured.

It will be apparent to those skilled in the art that various modifications and variations can be made to embodiments. Thus, it is intended that embodiments cover modifications and variations thereof within the scope of the appended claims.

What is claimed:

1. A method comprising:
   performing first mask data processing to change a design pattern;
   performing an optical proximity correction on the design pattern;
   checking results of the optical proximity correction and correcting the optical proximity results through optical rule checking;
   performing second mask data processing to change the design pattern,
   wherein the second mask design processing corrects bad corrections to an optical proximity effect after optical rule checking is performed.

2. The method of claim 1, wherein the design pattern is a design-verified pattern.

3. The method of claim 1, comprising performing design verification on a database of the design pattern by a design rule checker.

4. The method of claim 1, wherein the optical proximity correction includes model based optical proximity correction.

5. The method of claim 1, wherein the second mask design processing only corrects portions of the design pattern that need corrections.

6. The method of claim 5, wherein the second mask design processing only corrects portions of the design pattern that need corrections to an optical proximity effect.

7. The method of claim 1, wherein the method forms a mask pattern from a design pattern.

8. The method of claim 1, comprising generating a mask pattern from the design pattern.

9. The method of claim 8, wherein said generating the mask pattern is after the second mask design processing.

10. The method of claim 9, comprising sending the mask pattern to a mask shop.

* * * * *